(12) United States Patent
Bandyopadhyay et al.

(10) Patent No.: US 11,552,565 B2
(45) Date of Patent: Jan. 10, 2023

(54) SWITCH-MODE POWER SUPPLY WITH LOAD CURRENT BASED THROTTLING

(71) Applicant: Texas Instruments Incorporated, Dallas, TX (US)

(72) Inventors: Saurav Bandyopadhyay, Dallas, TX (US); Thomas Matthew LaBella, Raleigh, NC (US); Huy Le Nhat Nguyen, Raleigh, NC (US); Michael G. Amaro, Naperville, IL (US); Robert Allan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 135 days.

(21) Appl. No.: 16/860,511

(22) Filed: Apr. 28, 2020

(65) Prior Publication Data

US 2021/0050782 A1 Feb. 18, 2021

Related U.S. Application Data

(60) Provisional application No. 62/885,580, filed on Aug. 12, 2019.

(51) Int. Cl.
*H02M 3/158* (2006.01)
*G06F 1/26* (2006.01)
*H03K 17/082* (2006.01)
*H02M 1/00* (2006.01)

(52) U.S. Cl.
CPC .......... *H02M 3/158* (2013.01); *G06F 1/266* (2013.01); *H03K 17/0822* (2013.01); *H02M 1/0009* (2021.05)

(58) Field of Classification Search
CPC ....... H02M 3/158; H02M 1/009; G06F 1/266; H03K 17/0822
See application file for complete search history.

(56) References Cited

U.S. PATENT DOCUMENTS

| | | | |
|---|---|---|---|
| 10,895,601 B2* | 1/2021 | Bogus | G01R 31/2621 |
| 2016/0322900 A1* | 11/2016 | Xu | H02M 3/1588 |
| 2019/0252968 A1* | 8/2019 | Li | H02M 3/156 |
| 2020/0041356 A1 | 2/2020 | Neidorff et al. | |

* cited by examiner

*Primary Examiner* — Rafael O De Leon Domenech
(74) *Attorney, Agent, or Firm* — Ray A. King; Frank D. Cimino

(57) ABSTRACT

A switch-mode power supply circuit includes a low-side switching transistor, a high-side switching transistor, a low-side current sensing circuit, and a gate driver circuit. The low-side current sensing circuit is coupled to the low-side switching transistor and is configured to sense a current flowing through the low-side switching transistor. The gate driver circuit is coupled to the low-side current sensing circuit and the high-side switching transistor. The gate driver circuit is configured to generate a signal having a first drive strength to switch the high-side switching transistor based on current flowing through the low-side switching transistor being less than a threshold current, and to generate a signal having a second drive strength to switch the high-side switching transistor based on current flowing through the low-side switching transistor being greater than the threshold current. The first drive strength is greater than the second drive strength.

20 Claims, 6 Drawing Sheets

SWITCH-MODE POWER SUPPLY WITH LOAD CURRENT BASED THROTTLING

CROSS-REFERENCE TO RELATED APPLICATIONS

This application claims priority to U.S. Provisional Application No. 62/885,580, filed Aug. 12, 2019, entitled "Throttling Gate Driver Responsive to Load Current," which is hereby incorporated by reference.

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

SUMMARY

A switch-mode power supply circuit that throttles switching transistor gate drive based on load current is disclosed herein. In one example, a switch-mode power supply circuit includes a low-side switching transistor, a high-side switching transistor, a low-side current sensing circuit, and a gate driver circuit. The low-side switching transistor includes a first terminal, and a second terminal. The high-side switching transistor including a control terminal. The low-side current sensing circuit includes a first input terminal, a second input terminal, and an output terminal. The first input terminal is coupled to the first terminal of the low-side switching transistor. The second input terminal is coupled to the second terminal of the low-side switching transistor. The gate driver circuit includes a first gate driver and the second gate driver. The first gate driver includes an input terminal, and enable terminal, and an output terminal. The enable terminal is coupled to the output terminal of the low-side current sensing circuit. The output terminal is coupled to the control terminal of the high-side switching transistor. The second gate driver includes an input terminal coupled to the input terminal of the first gate driver, and an output terminal coupled to the output terminal of the first gate driver.

In another example, a switch-mode power supply circuit includes a low-side switching transistor, a high-side switching transistor, a low-side current sensing circuit, and a gate driver circuit. The low-side current sensing circuit is coupled to the low-side switching transistor and is configured to sense a current flowing through the low-side switching transistor. The gate driver circuit is coupled to the low-side current sensing circuit and the high-side switching transistor. The gate driver circuit is configured to generate a signal having a first drive strength to switch the high-side switching transistor based on current flowing through the low-side switching transistor being less than a threshold current, and to generate a signal having a second drive strength to switch the high-side switching transistor based on current flowing through the low-side switching transistor being greater than the threshold current. The first drive strength is greater than the second drive strength.

In a further example, power supply throttling circuit includes a voltage node, a switching node, a reference node, a high-side transistor control node, a low-side current sensing circuit, a high-side current sensing circuit, and a gate driver circuit. The low-side current sensing circuit is coupled to the switching node and the reference node and is configured to sense a first current flowing from the switching node to the reference node. The high-side current sensing circuit is coupled to the voltage node and the switching node and is configured to sense a second current flowing from the voltage node to the switching node. The gate driver circuit is coupled to the low-side current sensing circuit, the high-side current sensing circuit, and a high-side transistor control node, and is configured to provide a first drive strength to the high-side transistor control node based on the first current exceeding a first threshold or the second current exceeding a second threshold. The gate driver circuit is also configured to provide a second drive strength to the high-side transistor control node based on the first current not exceeding the first threshold and the second current not exceeding the second threshold.

BRIEF DESCRIPTION OF THE DRAWINGS

For a detailed description of various examples, reference will now be made to the accompanying drawings in which.

DETAILED DESCRIPTION

Switch-mode power supplies (such as DC-DC converters) often have ringing and overshoot due to series inductance and fast transition edges. In general, changing current in an inductor/capacitor (LC) circuit can produce a voltage spike and ringing. Switch-mode power supplies quickly switch current from one path to another. If the spike in the ringing is high enough, it can cause a transistor to experience breakdown voltage. And if the inductance has enough stored energy, breakdown voltage can lead to damage to the transistor. Both high and low side switching transistors are subject to such damage. Moreover, monolithic transistors are more fragile (more likely to be damaged) than discrete transistors due to limited avalanche capability. A common way to accommodate ringing is to use power switching devices (e.g., metal oxide semiconductor field effect transistors (MOSFETs)) with higher breakdown voltage. Devices with high breakdown voltage have higher capacitance and higher resistance, and are therefore less efficient. They are also more expensive. The ringing is also proportional to the output load of the converter. As such, a higher load current will likely lead to higher ringing and higher likelihood of transistor damage.

Since the LC ringing is proportional to load current, the circuits of the present disclosure introduce a solution that involves slowing down the driver as a function of load current. In one implementation, the disclosed solution includes two current sense circuits: peak current (high-side) sensing circuit and valley (low-side) current sensing circuit. One of the two sensing circuits will be triggered first to throttle (change the drive strength of) the driver. In particular, if any of the sensed outputs indicate a current that is higher than a preset threshold, then the driver will throttle the transistor turn on and turn off. The disclosed solution provides robust operation across different input and output voltages, as well as a wide range of frequencies. Moreover, some implementations of the disclosed solution are adapted to select from a few discrete drive strengths by switching in or out parallel drivers. In practice, throttling the drivers at heavy load conditions may optimize the efficiency at mid-load conditions where the switch-mode power supply operates for greater than 90% of its lifetime.

Figure 1:
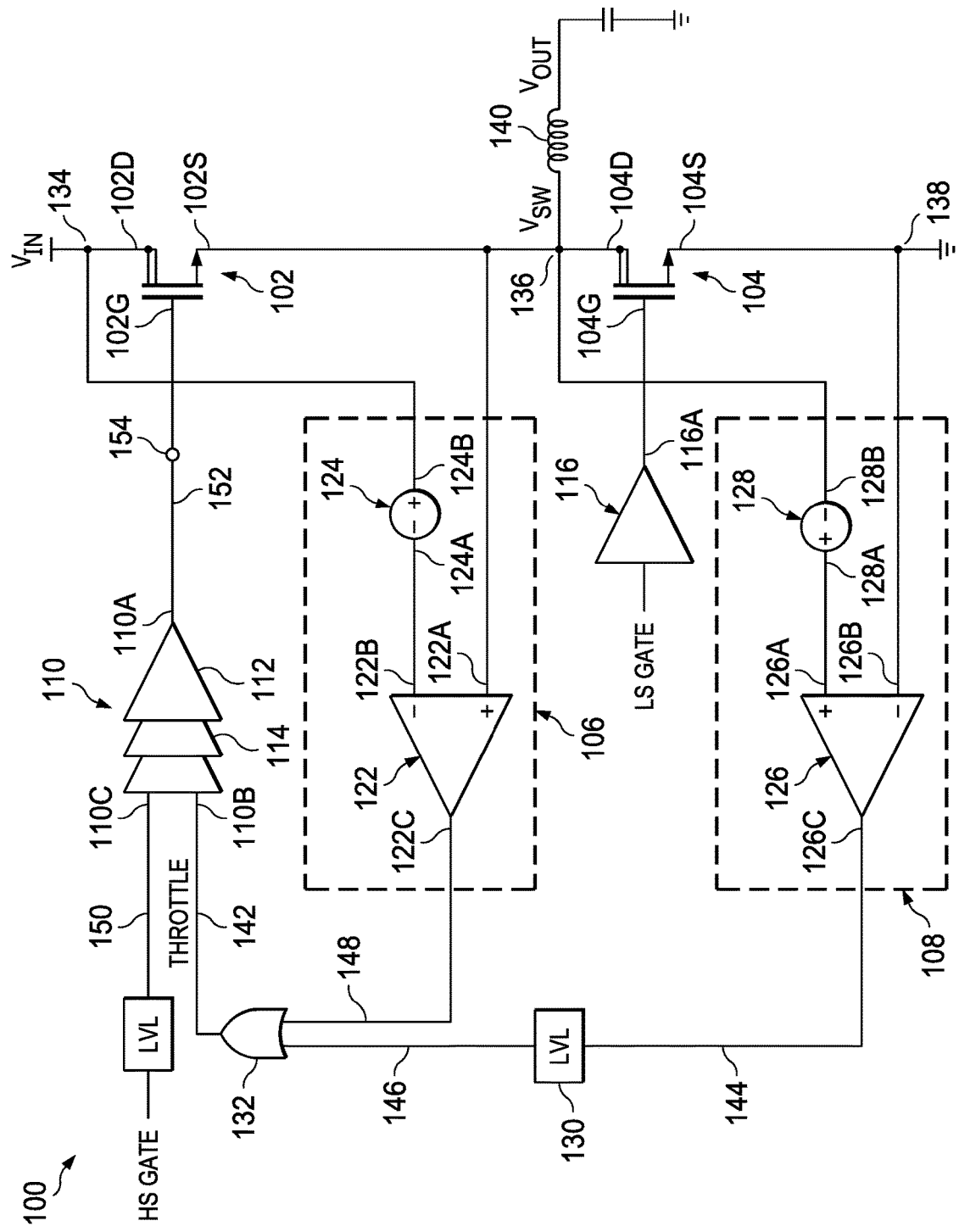
FIG. 1 shows a schematic level diagram for a switch-mode power supply that includes throttling of the high-side switching transistor gate drive in accordance with the present disclosure.

FIG. 1 shows a schematic level diagram for a switch-mode power supply 100 that includes throttling of the high-side switching transistor gate drive in accordance with the present disclosure. The switch-mode power supply 100 is a step-down (buck) converter. The switch-mode power supply 100 includes a high-side switching transistor 102, a low-side switching transistor 104, a high-side current sensing circuit 106, a low-side current sensing circuit 108, high-side gate driver circuit 110, a low-side gate driver circuit 116, a level shifter circuit 130, and a logical disjunction circuit 132. The switch-mode power supply 100 may include additional components that have been omitted from FIG. 1 in the interest of clarity. For example, the 100 may include a pulse width modulation circuit that that generates signals HS Gate and LS Gate for driving the high-side switching transistor 102 and the low-side switching transistor 104.

The high-side switching transistor 102 and the low-side switching transistor 104 may be N-channel MOSFETs. The high-side switching transistor 102 is turned on and the low-side switching transistor 104 is turned off to charge an inductor 140, while the high-side switching transistor 102 is turned off and the low-side switching transistor 104 is turned on to discharge the inductor 140. Ringing at the switching node 136 can damage the high-side switching transistor 102 or the low-side switching transistor 104, and the amplitude of the ringing is a function of the load current. The switch-mode power supply 100 controls the switching time of the high-side switching transistor 102 by adjusting the drive strength provided at the gate terminal 102G (control terminal) of the high-side switching transistor 102 based on the current flowing through the high-side switching transistor 102 and the current flowing through the low-side switching transistor 104. If the current flowing in the high-side switching transistor 102 exceeds a first threshold, or the current flowing in the low-side switching transistor 104 exceeds a second threshold, then the drive strength of signal 152 output by the high-side gate driver circuit 110 is reduced, which in turn increases the switching time of the high-side switching transistor 102 and reduces the amplitude of ringing at the switching node 136 during switching.

The high-side switching transistor 102 includes a drain terminal 102D coupled to a voltage node 134, a source terminal 102S coupled to the switching node 136, and a gate terminal 102G coupled to a high-side transistor control node 154. An output terminal 110A of the high-side gate driver circuit 110 is coupled to the high-side transistor control node 154 and the gate terminal 102G of the high-side switching transistor 102. The low-side switching transistor 104 includes a drain terminal 104D coupled to the switching node 136, a source terminal 104S coupled to the reference node 138, and a gate terminal 104G coupled to an output terminal 116A of the low-side gate driver circuit 116.

The high-side current sensing circuit 106 senses the current flowing in the high-side switching transistor 102 as a function of voltage drop across the high-side switching transistor 102. The high-side current sensing circuit 106 includes a comparator circuit 122 and a voltage source 124. A first input terminal 122A of the comparator circuit 122 is coupled to the switching node 136 and the source terminal 102S of the high-side switching transistor 102. A second input terminal 122B of the comparator circuit 122 is coupled to the terminal 124A of the voltage source 124. An output terminal 122C of the comparator circuit 122 is coupled to a throttle input terminal 110G of the high-side gate driver circuit 110 via the logical disjunction circuit 132.

The voltage source 124 generates an offset voltage that is referenced to the voltage at the voltage node 134 and applied to the input terminal 122B to establish a threshold voltage for comparison to the voltage at the input terminal 122A of the comparator circuit 122. A terminal 124B of the voltage source 124 is coupled to the voltage node 134. The comparator circuit 122 compares a voltage at the source terminal 102S of the high-side switching transistor 102 and a voltage at terminal 124A of the voltage source 124. When the voltage drop across the high-side switching transistor 102 exceeds the threshold set by the voltage source 124 (the voltage at the terminal 124A of the voltage source 124), the comparator circuit 122 activates an output signal 148 provided to the high-side gate driver circuit 110 to throttle the high-side switching transistor 102.

Some implementations of the high-side gate driver circuit 110 include multiple gate drivers, where each gate driver provides a different drive strength to the gate terminal 102G of the high-side switching transistor 102. For example, the high-side gate driver circuit 110 includes a gate driver 112 and a gate driver 114. When the throttle signal 142 is inactive, the gate driver 112 is selected to output a higher drive strength signal to the gate terminal 102G of the high-side switching transistor 102. When the throttle signal 142 is active, the gate driver 114 is selected to output a lower drive strength signal to the gate terminal 102G of the high-side switching transistor 102, which may increase the switching time of the high-side switching transistor 102 and reduce the amplitude of ringing at the switching node 136 (reduce the drain-source voltage of the low-side switching transistor 104 or the high-side switching transistor 102).

The low-side current sensing circuit 108 senses the current flowing in the low-side switching transistor 104 as a function of voltage drop across the low-side switching transistor 104. The low-side current sensing circuit 108 includes a comparator circuit 126 and a voltage source 128. A first input terminal 126B of the comparator circuit 126 is coupled to the reference node 138 and the source terminal 104S of the low-side switching transistor 104. A second input terminal 126A of the comparator circuit 126 is coupled to the terminal 128A of the voltage source 128. An output terminal 126C of the comparator circuit 126 is coupled to the throttle input terminal 110B of the high-side gate driver circuit 110 via the logical disjunction circuit 132.

The voltage source 128 generates an offset voltage that is referenced to the voltage at the switching node 136 and applied to the input terminal 126A to establish a threshold voltage for comparison to the voltage at the input terminal 126B of the comparator circuit 126. A terminal 128B of the voltage source 128 is coupled to the switching node 136. The comparator circuit 126 compares a voltage at the source terminal 104S of the low-side switching transistor 104 and a voltage at terminal 128A of the voltage source 128. When the voltage drop across the low-side switching transistor 104 exceeds the threshold set by the voltage source 128, the comparator circuit 126 activates an output signal 144 provided to the high-side gate driver circuit 110 to throttle the high-side switching transistor 102.

Because the low-side switching transistor 104 is referenced to the reference node 138 and the high-side switching transistor 102 is referenced to the switching node 136, the output signal 144 generated by the comparator circuit 126 is level shifted by the level shifter circuit 130. The logical disjunction circuit 132 combines the signal 146 generated by the level shifter circuit 130 and the output signal 148 generated by the comparator circuit 122 to produce the throttle signal 142. The logical disjunction circuit 132 may be an OR-gate.

Figure 2:
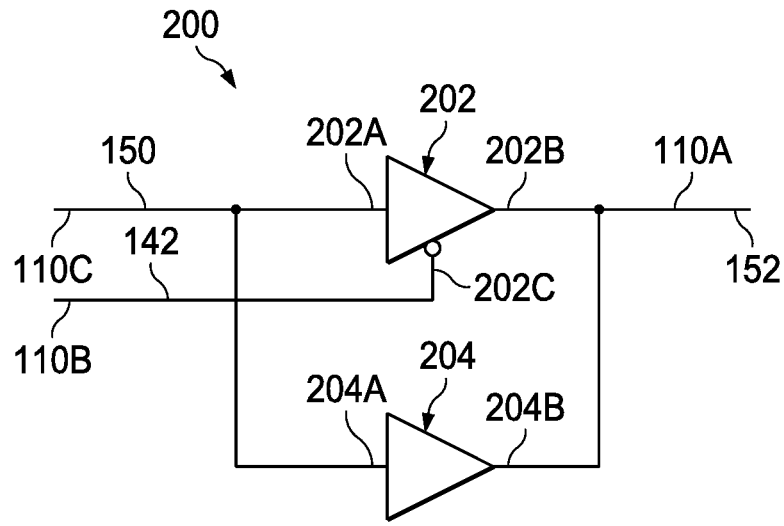
FIG. 2 shows a schematic level diagram for a gate driver circuit that provides throttling in accordance with the present disclosure.

FIG. 2 shows a schematic level diagram for a gate driver circuit 200 that allows throttling in accordance with the present disclosure. The gate driver circuit 200 is an implementation of the high-side gate driver circuit 110. The gate driver circuit 200 includes a gate driver 202 and a gate driver 204. When the throttle signal 142 is inactive, both the gate driver 204 and the gate driver 202 are enabled, and the when the throttle signal 142 is active the gate driver 202 is disabled and the gate driver 204 is enabled. Thus, the gate driver circuit 200 generates a higher drive strength output (e.g., a higher ratio between an amount of current the driver conducts over a voltage at an output of the driver) when the throttle signal 142 inactive than when the throttle signal 142 is active.

The input terminal 202A of the gate driver 202 is coupled to the input terminal 204A of the gate driver 204 and the input terminal 110C of the high-side gate driver circuit 110. The enable terminal 202C of the gate driver 202 is coupled to the throttle input terminal 110B of the high-side gate driver circuit 110. The output terminal 202B of the gate driver 202 is coupled to the output terminal 204B of the gate driver 204 and the output terminal 110A of the high-side gate driver circuit 110.

Figure 3:
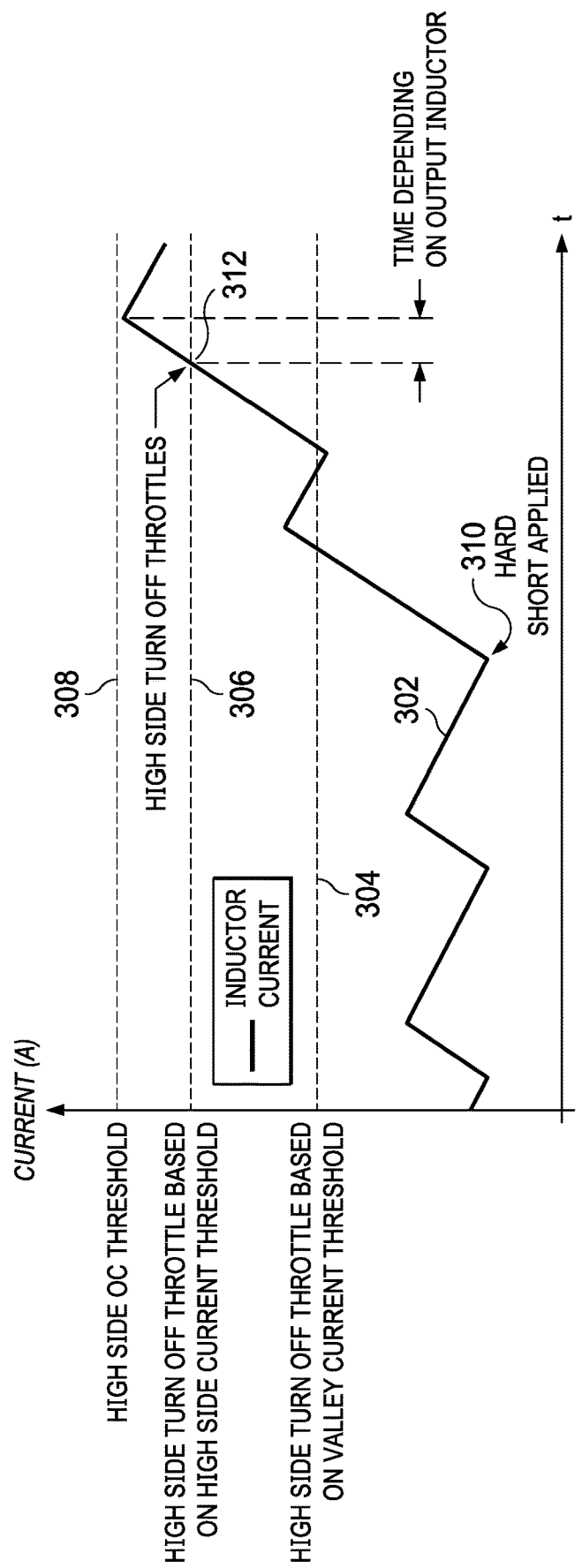
FIG. 3 shows an example of a hard short on the output of a switch-mode power supply with throttling based on high-side current sensing in accordance with the present disclosure.

FIG. 3 shows an example of a hard short on the output of the switch-mode power supply 100. In FIG. 3, current 302 in the inductor 140 is illustrated over time along with a low-side current threshold 304, a high-side current threshold 306, and an overcurrent threshold 308. The low-side current threshold 304 corresponds to the threshold set by the voltage source 128, and the high-side current threshold 306 corresponds to the threshold set by the voltage source 124. A hard short is applied to the switch-mode power supply 100 at 310. The hard short increases the time during which the high-side switching transistor 102 is active to charge the inductor 140. In the switch-mode power supply 100, at 312, the high-side current sensing circuit 106 detects the current in the high-side switching transistor 102 exceeding the high-side current threshold 306 and the throttle signal 142 is activated to throttle the high-side switching transistor 102 thereby slowing down the turn off of the high-side switching transistor 102. The high-side current sensing circuit 106 may include blanking times and propagation delays (e.g., 70-80 nanoseconds). The relatively long on time of the high-side switching transistor 102 produced by the hard short allows the high-side current sensing circuit 106 to detect the current in the high-side switching transistor 102 over the high-side current threshold 306. Thus, in the example of FIG. 3, the high-side current sensing circuit 106 initiates throttling via the logical disjunction circuit 132.

Figure 4:
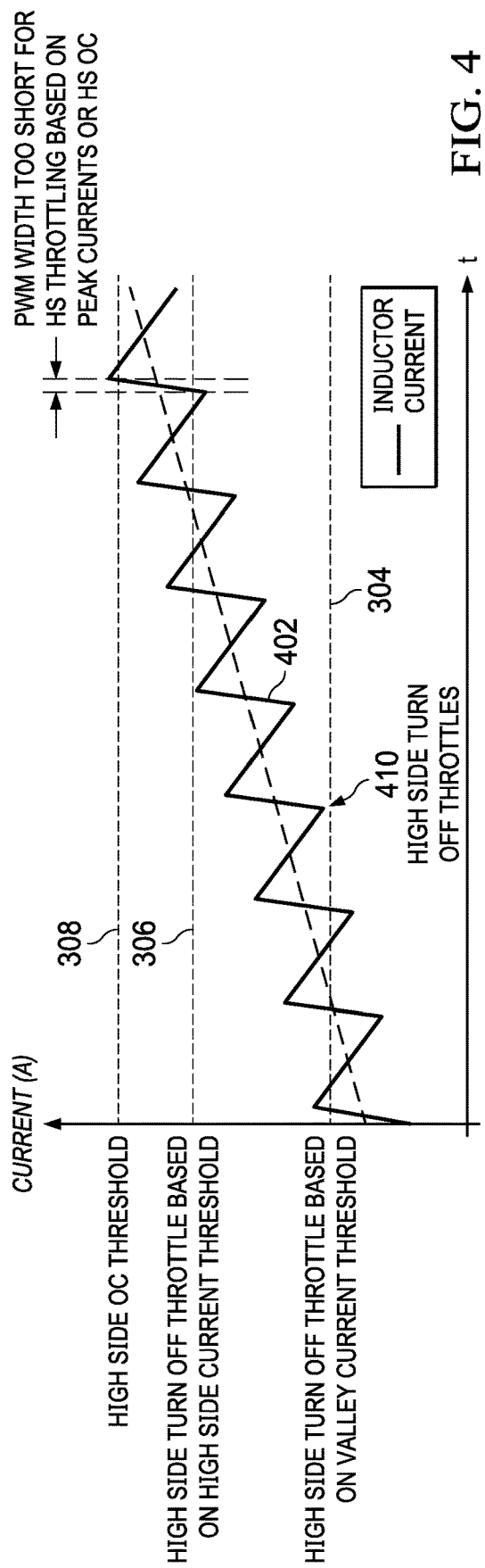
FIG. 4 shows an example of a soft short on the output of a switch-mode power supply with throttling based on low-side current sensing in accordance with the present disclosure.

FIG. 4 shows an example of a soft short on the output of the switch-mode power supply 100. In FIG. 4, current 402 in the inductor 140 is illustrated over time along with a low-side current threshold 304, a high-side current threshold 306, and an overcurrent threshold 308. In FIG. 4, the soft short does not increase the time during which the high-side switching transistor 102 is active enough to allow the high-side current sensing circuit 106 to detect current in the high-side switching transistor 102 over the high-side current threshold 306 (e.g., due to blanking in the high-side current sensing circuit 106 that delays detection). Instead, with the soft short of FIG. 4, the low-side current sensing circuit 108 detects current in the low-side switching transistor 104 over the low-side current threshold 304 at the valley 410. Thus, in the example of FIG. 4, the low-side current sensing circuit 108 initiates throttling via the logical disjunction circuit 132.

Figure 5:
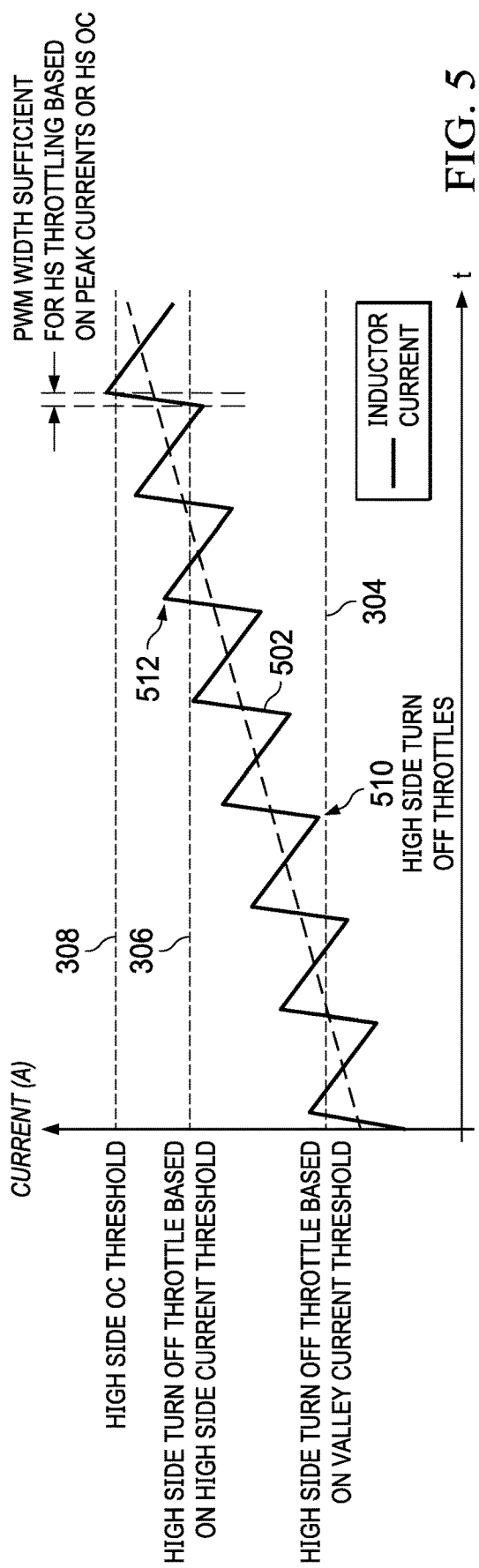
FIG. 5 shows an example of a soft short on the output of a switch-mode power supply with throttling based on high-side current sensing and low-side current sensing in accordance with the present disclosure.

FIG. 5 shows another example of a soft short on the output of the switch-mode power supply 100. In FIG. 5, current 502 in the inductor 140 is illustrated over time along with a low-side current threshold 304, a high-side current threshold 306, and an overcurrent threshold 308. In FIG. 5, the time during which the high-side switching transistor 102 is active is sufficient to allow the high-side current sensing circuit 106 to detect current in the high-side switching transistor 102 over the high-side current threshold 306 (at the peak 512), and the low-side current sensing circuit 108 may also detect current in the low-side switching transistor 104 over the low-side current threshold 304 at the valley 410. Under these conditions, the one of the high-side current sensing circuit 106 and the low-side current sensing circuit 108 that senses current over the associated threshold first controls throttling of the high-side switching transistor 102.

Figure 6:
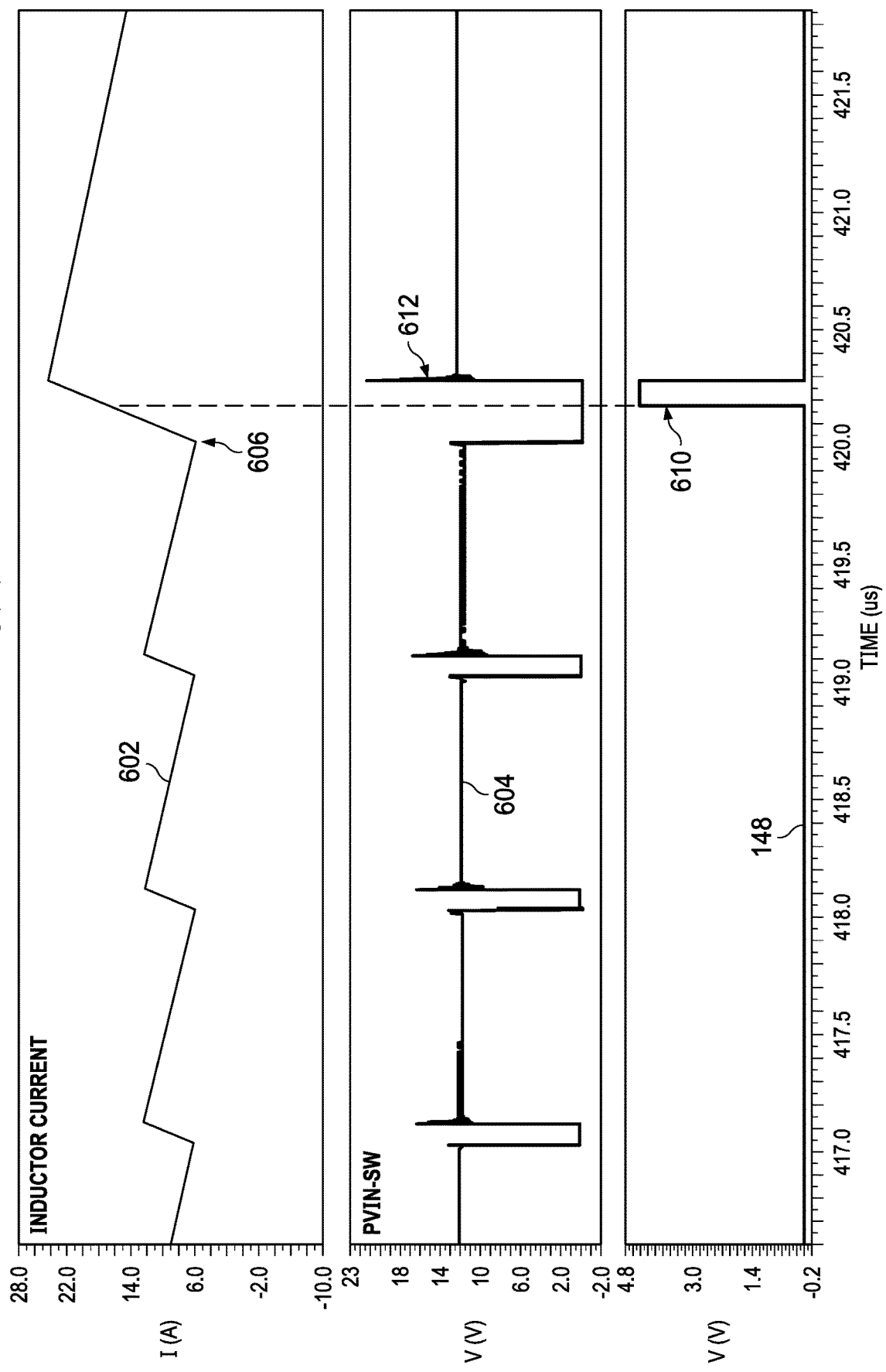
FIG. 6 shows a simulation of an overcurrent condition caused by a hard short in a switch-mode power supply in accordance with the present disclosure.

FIG. 6 shows a simulation of an overcurrent condition caused by a hard short in the switch-mode power supply 100 in accordance with the present disclosure. In FIG. 6, inductor current 602 (i.e., current in the inductor 140), PVIN-SW 604 (voltage difference between voltage node 134 and switching node 136), and the throttle signal 142 are shown. At 606 a hard short is applied at the output of the switch-mode power supply 100. At 610, the inductor current 602 exceeds the threshold set by the voltage source 124 and the high-side current sensing circuit 106 activates the output signal 148. Responsive to the output signal 148, the high-side gate driver circuit 110 reduces the drive strength provided at the gate terminal 102G of the high-side switching transistor 102. The switching time of the high-side switching transistor 102 is increased, and the amplitude of the ringing 612 is decreased.

Figure 7:
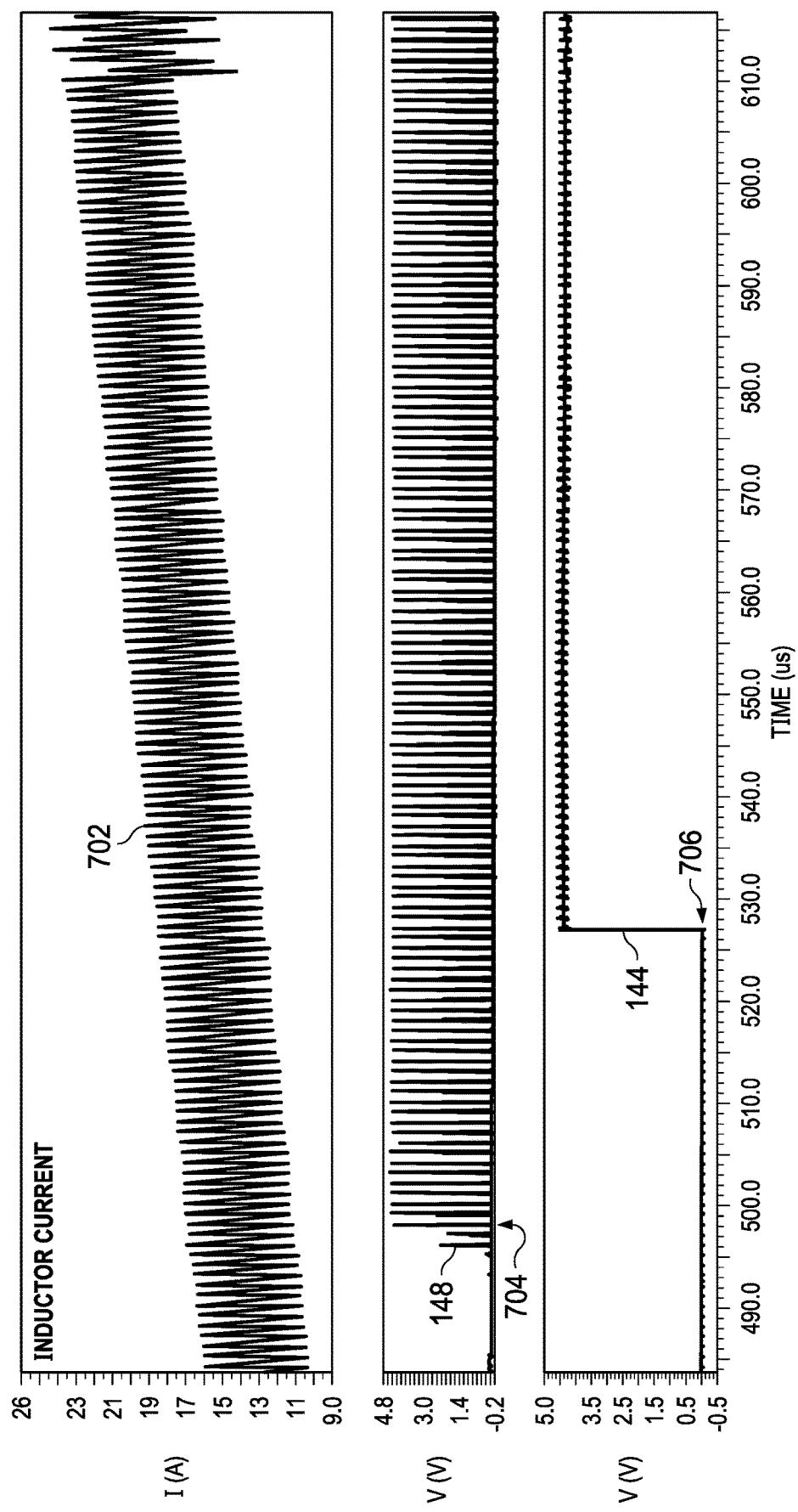
FIG. 7 shows a simulation of an overcurrent condition caused by a soft short in a switch-mode power supply in accordance with the present disclosure.

FIG. 7 shows a simulation of an overcurrent condition caused by a soft short in a switch-mode power supply in accordance with the present disclosure. In FIG. 7, inductor current 702 (i.e., current in the inductor 140), the output signal 148 of the high-side current sensing circuit 106, and the output signal 144 of the low-side current sensing circuit 108 are shown. In FIG. 7, a soft short is applied at the output of the switch-mode power supply 100 and the average current in the inductor 140 is rising relatively slowly. At about 704, the inductor current 702 exceeds the threshold set by the voltage source 124, and the high-side current sensing circuit 106 activates the output signal 148 based on peak current. Responsive to the output signal 148, the high-side gate driver circuit 110 reduces the drive strength provided at the gate terminal 102G of the high-side switching transistor 102. The switching time of the high-side switching transistor 102 is increased, and the amplitude of the ringing 612 is decreased. At 706, the inductor current 702 exceeds the threshold set by the voltage source 128 and the low-side current sensing circuit 108 activates the output signal 144 based on valley current. In FIG. 7, throttling may be based on output of either the high-side current sensing circuit 106 or the low-side current sensing circuit 108.

Figure 8:
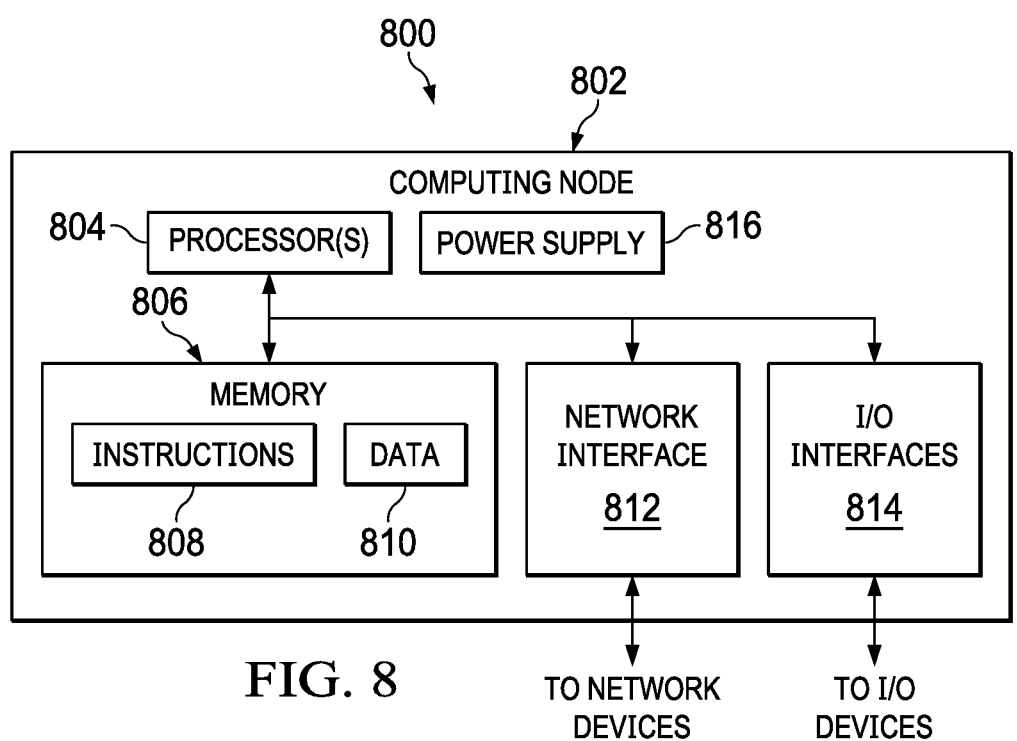
FIG. 8 shows a block diagram for a server system that includes a switch-mode power supply that provides throttling of the high-side switching transistor gate drive as described herein.

FIG. 8 shows a block diagram for a server system 800 that includes a switch-mode power supply that provides throttling of the high-side switching transistor gate drive as described herein. The server system 800 includes one or more computing nodes 802. Each computing node 802 includes one or more processors 804 coupled to memory 806, a network interface 812, and one or more I/O interfaces 814. In various embodiments, a computing node 802 may be a uniprocessor system including one processor 804, or a multiprocessor system including several processors 804 (e.g., two, four, eight, or another suitable number). Processors 804 may be any suitable processor capable of executing instructions. For example, in various embodiments, processors 804 may be general-purpose or embedded microprocessors, graphics processing units (GPUs), digital signal processors (DSPs) implementing any of a variety of instruction set architectures (ISAs). In multiprocessor systems, each of the processors 804 may commonly, but not necessarily, implement the same ISA.

The memory 806 may include a non-transitory, computer-readable storage medium configured to store program instructions and/or data accessible by processors 804. The memory 806 may be implemented using any suitable memory technology, such as static random-access memory (SRAM), synchronous dynamic RAM (SDRAM), nonvolatile/Flash-type memory, or any other type of memory.

The server system 800 may also include secondary storage, which may be implemented using volatile or non-volatile storage and storage devices for storing information such as program instructions and/or data. The secondary storage may include various types of computer-readable media accessible by the computing node 802. A computer-readable medium may include storage media or memory media such as semiconductor storage, magnetic or optical media, e.g., disk or CD/DVD-ROM, or other storage technologies.

The network interface 812 includes circuitry configured to allow data to be exchanged between computing node 802 and/or other devices coupled to a network. For example, the network interface 812 may be configured to allow data to be exchanged between a first instance of the server system 800 and a second instance of the server system 800. The network interface 812 may support communication via wired or wireless data networks.

The I/O interfaces 814 allow the computing node 802 to communicate with devices external to the server system 800. Devices coupled to the server system 800 via the I/O interfaces 814 may include one or more display terminals, keyboards, keypads, touchpads, scanning devices, voice or optical recognition devices, or any other devices suitable for entering or retrieving data by the computing node 802. Multiple input/output devices may be present in a server system 800.

The power supply 816 generates the voltages that power the various components of the computing node 802. For example, the power supply 816 may provide power to the processors 804, the memory 806, or any other components of the computing node 802. The power supply 816 includes an implementation of the switch-mode power supply 100 to generate one or more of the voltages that power the computing node 802. Because the throttling implemented in the switch-mode power supply 100 reduces ringing at the switching node 136, the voltage rating of the switching transistors 102 and 104 may be reduced to allow reduced transistor size, provide higher efficiency, and faster switching, which in turn, increases the efficiency of computing node 802.

Detection of heavy loading and throttling the high-side switching transistor 102 of the switch-mode power supply 100 when heavy loading is detected allows the efficiency of the switch-mode power supply 100 to be improved over a range of medium loads, where the switch-mode power supply 100 typically operates (>90% of the time). The switch-mode power supply 100 includes a high-side current sensing circuit 106 and a low-side current sensing circuit 108 to ensure that heavy loading is detected under a variety of operating conditions (e.g., hard and soft short conditions, heavy load operating conditions, etc.) The throttling allows the high-side switching transistor 102 and the low-side switching transistor 104 to be implemented as low-voltage devices which reduce size and cost, and increase switching speed.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A switch-mode power supply circuit, comprising:
   a first transistor having a control terminal and first and second terminals;
   a second transistor having a control terminal and first and second terminals, the second terminals of the first and second transistors coupled together;
   a first sensing circuit having first and second input terminals and an output terminal, the first input terminal coupled to the first terminal of the first transistor, the second input terminal coupled to the second terminal of the first transistor;
   a second sensing circuit having first and second input terminals and an output terminal, the first input terminal of the second sensing circuit coupled to the first terminal of the second transistor, and the second input terminal of the second sensing circuit coupled to the second terminal of the second transistor;
   a logic circuit having first and second input terminals and an output terminal, the first input terminal of the logic circuit coupled to the output terminal of the first sensing circuit, the second input terminal of the logic circuit coupled to the output terminal of the second sensing circuit;

a first driver circuit having first and second input terminals and an output terminal, the first input terminal of the first driver circuit coupled to the output terminal of the logic circuit, the output terminal of the first driver circuit coupled to the control terminal of the first transistor, the first driver circuit configured to output a drive signal responsive to a pulse width modulation signal at the second input terminal of the first driver circuit and a signal from the logic circuit at the first input terminal of the first driver circuit; and a second driver circuit having an output terminal coupled to the control terminal of the second transistor.

2. The switch-mode power supply circuit of claim 1, wherein:

the first sensing circuit is configured to compare a voltage at the second input terminal of the first sensing circuit with a first threshold voltage at the first input terminal of the first sensing circuit and provide a first enable signal at the output terminal of the first sensing circuit, the first threshold voltage responsive to a voltage at the first terminal of the first transistor; and the second sensing circuit is configured to compare a voltage at the first input terminal of the second sensing circuit with a second threshold voltage at the second input terminal of the second sensing circuit and provide a second enable signal at the output terminal of the second sensing circuit, the second threshold voltage responsive to a voltage at the second terminal of the second transistor.

3. The switch-mode power supply circuit of claim 1, wherein the logic circuit includes a logic OR gate having a first input terminal coupled to the output terminal of the first sensing circuit, having a second input terminal coupled to the output terminal of the second sensing circuit, and having an output terminal coupled to the first input terminal of the first driver circuit.

4. The switch-mode power supply circuit of claim 1, wherein the first sensing circuit includes:

a voltage source coupled to the first terminal of the first transistor; and a comparator circuit having a first input terminal coupled to the voltage source, having a second input terminal coupled to the second terminal of the first transistor, and having an output terminal coupled to the first input terminal of the logic circuit.

5. The switch-mode power supply circuit of claim 4, wherein the voltage source has first and second terminals, the first terminal of the voltage source coupled to the first terminal of the first transistor, the second terminal of the first voltage source coupled to the first input terminal of the comparator circuit.

6. The switch-mode power supply circuit of claim 1, wherein the second sensing circuit includes:

a voltage source coupled to the second terminal of the second transistor; and a comparator circuit having a first input terminal coupled to the voltage source, having a second input terminal coupled to the first terminal of the second transistor, and having an output terminal coupled to the second input terminal of the logic circuit.

7. The switch-mode power supply circuit of claim 6, wherein the voltage source has first and second terminals, the first terminal of the voltage source coupled to the second terminal of the second transistor, the second terminal of the voltage source coupled to the first input terminal of the comparator circuit.

8. The switch-mode power supply circuit of claim 1, further comprising:

a level shifter having an input terminal and an output terminal, the input terminal of the level shifter coupled to the output terminal of the second sensing circuit, and the output terminal of the level shifter coupled to the second input terminal of the logic circuit.

9. A switch-mode power supply circuit, comprising:

a low-side switching transistor having first and second terminals;

a high-side switching transistor having a control terminal;

a first current sensing circuit coupled to the low-side switching transistor, the first current sensing circuit including:

a voltage source having a first terminal coupled to the second terminal of the low-side switching transistor and having a second terminal; and a comparator having a first input coupled to the second terminal of the voltage source, having a second input coupled to the first terminal of the low-side switching transistor, and having an output;

a second current sensing circuit coupled to the high-side transistor and having an output; and a driver circuit having a first input terminal coupled to the output of the comparator and coupled to the output of the second current sensing circuit, having a second input terminal, and having an output terminal coupled to the control terminal of the high-side switching.

10. The switch-mode power supply circuit of claim 9, wherein:

the first current sense circuit is configured to sense a first current through the low-side transistor; and the second current sensing circuit is configured to sense a second current through the high-side switching transistor.

11. The switch-mode power supply circuit of claim 10, further comprising a logic circuit having first and second input terminals and an output terminal, the first input terminal of the logic circuit coupled to the output of the comparator, the second input terminal of the logic circuit coupled to the output of the second current sensing circuit, and the output of the logic circuit coupled to the first input terminal of the driver circuit.

12. The switch-mode power supply circuit of claim 11, wherein the logic circuit includes a logic OR gate having a first input terminal coupled to of the comparator circuit, having second input terminal coupled to the output of the second current sensing circuit, and having an output coupled to the first input terminal of the driver circuit.

13. The switch-mode power supply circuit of claim 9, wherein:

the high-side switching transistor has first and second terminals; and the second current sensing circuit includes:

a second voltage source having a first terminal coupled to the first terminal of the high-side switching transistor, and having a second terminal; and a second comparator having a first input coupled to the second terminal of the second voltage source, having a second input coupled to the second terminal of the high-side switching transistor, and having an output coupled to the first input terminal of the driver circuit.

14. The switch-mode power supply circuit of claim 9, wherein the driver circuit is configured to:
  generate a first drive signal responsive to a switching signal at the second input terminal of the driver circuit and responsive to a current through the low-side switching transistor being less than a threshold current; and
  generate a second drive signal responsive to the switching signal and responsive to the current through the low-side switching transistor being greater than the threshold current.

15. The switch-mode power supply circuit of claim 14, wherein:
  the threshold current is a first threshold current; and
  the driver circuit is further configured to:
    generate a third drive signal responsive to the switching signal and responsive to current through the high-side switching transistor being less than a second threshold current; and
    generate a fourth drive signal responsive to the switching signal and responsive to the current through the high-side switching transistor being greater than the second threshold current.

16. A circuit, comprising:
  An input voltage node;
  a switching node;
  a reference node;
  a high-side transistor control node;
  a first current sensing circuit coupled to the switching node and the reference node and configured to sense a first current;
  a second current sensing circuit coupled to the input voltage node and the switching node and configured to sense a second current; and
  a driver circuit having a first input terminal coupled to the first and the second current sensing circuits, having a second input terminal, and having an output terminal coupled to the high-side transistor control node, the driver circuit configured to:
    provide a first control signal to the high-side transistor control node responsive to a pulse width modulation signal at the second input terminal and responsive to the first current exceeding a first threshold or the second current exceeding a second threshold; and
    provide a second control signal to the high-side transistor control node responsive to the pulse width modulation signal and responsive to the first current not exceeding the first threshold and the second current not exceeding the second threshold.

17. The circuit of claim 16, wherein the second threshold is higher than the first threshold.

18. The circuit of claim 16, wherein:
  the second current sensing circuit includes:
    a comparator circuit having first and second input terminals and an output terminal, the first terminal of the comparator circuit coupled to the switching node, the output terminal of the comparator circuit coupled to the first input terminal of the driver circuit; and
    a voltage source having first and second terminals, the first terminal of the voltage source coupled to the voltage node, the second terminal of the voltage source coupled to the second input terminal of the comparator circuit.

19. The circuit of claim 16, wherein:
  the first current sensing circuit includes:
    a comparator circuit having first and second input terminals and an output terminal, the first input terminal of the comparator circuit coupled to the reference node, the output terminal of the comparator circuit coupled to the first input terminal of the driver circuit; and
    a voltage source having first and second terminals, the first terminal of the voltage source coupled to the switching node, the second terminal of the voltage source coupled to the second input terminal of the comparator circuit.

20. The circuit of claim 16, wherein the driver circuit is a first driver circuit, the circuit further comprising:
  a low-side transistor control node; and
  a second driver circuit having an output terminal coupled to the low-side transistor control node.

* * * * *